United States Patent [19]

Miyazaki et al.

[11] Patent Number: 5,351,182

[45] Date of Patent: Sep. 27, 1994

[54] LEVEL SHIFT CIRCUIT AND INVERTER APPARATUS USING THE SAME

[75] Inventors: Hideki Miyazaki, Hitachi; Tsunehiro Endo, Narashino; Kouzou Watanabe; Yuhachi Takakura, both of Hitachi; Koichi Suda, Mito, all of Japan

[73] Assignee: Hitachi, Ltd., Tokyo, Japan

[21] Appl. No.: 143,136

[22] Filed: Oct. 29, 1993

[30] Foreign Application Priority Data

Nov. 2, 1992 [JP] Japan ............... 4-294323

[51] Int. Cl.$^5$ .............................. H02M 7/5387
[52] U.S. Cl. ................................. 363/132; 363/98
[58] Field of Search ............... 363/16, 17, 56, 58, 363/95, 97, 98, 131, 132

[56] References Cited

U.S. PATENT DOCUMENTS

| | | | |
|---|---|---|---|
| 4,316,243 | 2/1982 | Archer | 363/132 |
| 4,942,341 | 7/1990 | Imaizumi | 315/403 |
| 4,989,127 | 1/1991 | Wegener | 363/16 |
| 5,216,587 | 6/1993 | Miyazaki et al. | 363/132 |
| 5,229,927 | 7/1993 | Vila-Masot et al. | 363/98 |

FOREIGN PATENT DOCUMENTS 4230117 8/1992 Japan ................... 363/132

OTHER PUBLICATIONS

IEEE Journal of Solid-State Circuits vol. 25, No. 3, 1980, pp. 677-683.

Primary Examiner—Steven L. Stephan
Assistant Examiner—Matthew Nguyen
Attorney, Agent, or Firm—Antonelli, Terry, Stout & Kraus

[57] ABSTRACT

An inverter apparatus includes a flip-flop circuit and a voltage clamp circuit disposed in the upper arm, and set and reset signal generators each having a series connection of two switching devices. By using an input signal and using an output signal of the flip-flop circuit, the above described two switching devices are activated in a complementary manner. Owing to this configuration, no current flows except a minute time for supplying a trigger signal to the flip-flop circuit, resulting in low current consumption. If the output logic of the flip-flop circuit has been inverted by noise, two switching devices are simultaneously in the on-state and a re-trigger current is let flow to restore the above described output logic to the normal state, resulting in the complementary state again. As a result, signal transmission between the upper and lower arms is performed at higher speed and with a lower loss. In addition, the inverter apparatus is protected from false operation due to noise.

7 Claims, 9 Drawing Sheets

LEVEL SHIFT CIRCUIT AND INVERTER APPARATUS USING THE SAME

BACKGROUND OF THE INVENTION

The present invention relates to an inverter i apparatus including at least one arm having first and second power switching devices connected in series between high voltage power source terminals. In particular, the present invention relates to an inverter apparatus having a step-up level shift circuit for transmitting a control signal from a negative side circuit to a positive side circuit and/or a step-down level shift circuit for transmitting a control signal from a positive side circuit to a negative side circuit.

In a conventional inverter apparatus having a first power switching device disposed in a positive side arm (hereafter referred to as upper arm) between high voltage power source terminals and a second power switching device disposed in a negative side arm (hereafter referred to as lower arm) and connected with the first power switching device in a totem-pole form (i.e., in series), the first power switching device of the upper arm is driven in a floating voltage condition with respect to a reference potential and a power source insulated by a transformer is used in a drive circuit for the first power switching device.

For transmitting a drive signal from a negative side circuit to a positive side circuit, a level shift circuit capable of transmitting signals even in the floating voltage condition (hereafter referred to as step-up level shift circuit) is needed. A photocoupler or a pulse transformer is typically used. On the contrary, a level shift circuit for transmitting signals from a positive side circuit to a negative side circuit is hereafter referred to as step-down level shift circuit. Both level shift circuits are required to be high in signal transmission speed and low in power consumption. For achieving a smaller size of an inverter apparatus and a higher speed of signal transmission, it has recently been studied to form the level shift circuit as a monolithic integrated circuit. For example, a step-up level shift circuit has been discussed in IEEE Journal of Solid-State Circuits, Vol. 25, No. 3, Jun. 1990, pp. 677–683.

FIG. 1 is a configuration diagram of a step-up level shift circuit disclosed in the above described literature.

In FIG. 9, Q1 and Q2 denote first and second power switching devices, respectively. Q1 and Q2 belong to an upper arm and a lower arm, respectively. T1 to T10 denote transistors. Among them, T3 and T4 are high voltage N-channel MOSFETs and other transistors are low voltage bipolar transistors. R1 to R6 denote resistors, and N1 to N4 denote logic inverters. Numeral 100 and 101 denote driver circuits for Q1 and Q2, respectively. VE denote a high voltage power source (several hundreds V). Vcc denotes a low voltage power source (15 V). VDD denotes a power source supplying a voltage (7 V) smaller than Vcc. DB and CB denote a diode and a capacitor for forming a low voltage power source for the upper arm, respectively.

The circuit which supplies a set or reset trigger pulse to a flip-flop formed by N1 and N2 is the level shift circuit. A level shift circuit of the set side is formed by a series circuit of R1, T3, T5 and R3 connected between a positive terminal of CB and a negative terminal of Vcc. In the same way, a level shift circuit of the reset side is formed by a series circuit of R2, T4, T7 and R4.

How to drive Q1 by using the level shift circuit configured as described above will hereafter be described. If a set pulse having a pulse width t1 is inputted to an input terminal of a logic inverter N3 and an input terminal of an inverter N4 is fixed at a high level, then the transistors T5 and T6 turn on. Since T5 turns on, gate voltage from VDD is applied between a gate terminal of the MOSFET T3 and a source terminal thereof, thereby turning on T3. As a result, both switch devices T3 and T5 included in the set-side series circuit (R1, T3, T5 and R3) turn on, thereby letting flow a current Is through the series circuit. Since a part of this Is flows as a base current of the transistor T1, the transistor T1 turns on, thereby turning on the transistor T9 as well. Since T9 turns on, a terminal Q of the flip-flop circuit formed by N1 and N2 becomes a low level. As for the state of the flip-flop, Q is hereafter fixed at the low level and $\overline{Q}$ is fixed at a high level. When a time t1 has elapsed, the set pulse inputted to N3 becomes a high level. However, the flip-flop of N1 and N2 is already fixed in state and does not change. Since the input terminal is fixed at the high level, the output of N4 becomes a low level. Since the transistors T7, T8 and T4 are thus in the off-state, a current does not flow through a reset-side series circuit (R2, T4, T7 and R4). Thereby, T2 and T10 are also in the off-state. Since the output of Q becomes a low level, a driver circuit 100 turns Q1 on. In order to then turn Q1 off, the input terminal of N3 is fixed at the high level and a reset pulse which becomes a low level for an interval t2 is inputted to the input terminal of N4, in contrast with the above described action. Thereby, T10 turns on and the terminal $\overline{Q}$ of the flip-flop circuit becomes a low level. As for the state of the flip-flop, Q is hereafter fixed at a high level and $\overline{Q}$ is fixed at a low level. Since Q changes from the low level to the high level, the driver circuit 100 receiving this signal turns Q1 off. At this time, all of the transistors T3, T5 and T6 are in the off-state, and the current Is does not flow through the set-side series circuit.

When the output of Q becomes the low level as a result of application of the set pulse, the driver circuit 100 turns Q1 on by using this signal. At this time, however, the voltage Vo at an output terminal 0 rises abruptly. Noise currents, which are determined by the product of the rate of voltage change dV/dt and drain-source parasitic capacitance of the MOS transistors T3 and T4, flow through T3 and T4. In the illustrated example, influences of the above described noise currents are cancelled by placing T1 and T2 and T9 and T10 in a differential circuit configuration.

By using the differential circuit configuration, the above described level shift circuit is made less susceptible to the influence of the noise currents caused by dV/dt. Achievement of this object makes it a condition that the drain-source parasitic capacitance of T3 is equal to that of T4. On the other hand, if the set pulse is still applied in the low level state when Q1 turns on, T3 is in the on-state and the drain-source parasitic capacitance of T3 in the on-state is different from that of T4 in the off-state. In the above described level shift circuit, therefore, the width t1 of the set pulse and the width t2 of the reset pulse must be made sufficiently short, respectively. If each width is made shorter than the delay time of the circuit, however, a signal can be conveyed to the flip-flop. It is thus not easy to set t1 and t2.

As for the noise currents flowing through T3 and T4 of the above described level shift circuit when Q1 has turned on or turned off, countermeasures have been studied. For the case where the logic state of the terminal Q or $\overline{Q}$ of the flip-flop is directly inverted by noise, however, countermeasures have not been studied.

SUMMARY OF THE INVENTION

The present invention eliminates the above described problems. An object of the present invention is to provide an inverter apparatus including a level shift circuit which has a high voltage characteristic, an excellent signal response characteristic, and less power consumption (less current consumption), and which prevents false noise operation caused by dV/dt at the time of transition of power switching devices or other factors.

In order to achieve the above described object, an inverter apparatus according to the present invention includes arras including first and second power switching devices connected in series between terminals of a high voltage power source; first and second driver circuits for selectively supplying outputs of first and second low voltage power sources disposed in respective arms to control electrodes of the first and second power switching devices; a step-up level shift circuit for converting an input signal having a potential of one of electrodes of the first low voltage power source as a reference potential to a signal having a potential of one of electrodes of the second low voltage power source as a reference potential and transmitting the converted signal to the driver circuit; the step-up level shift circuit including a flip-flop circuit connected to the second low voltage power source, first and second trigger generator circuits connected between the first low voltage power source and the second low voltage power source so as to responsive to the input signal to supply a set or reset signal to the flip-flop circuit; each of the first and second trigger generator circuits having a series circuit including a voltage clamping circuit, a first switching device, and a second switching device; a first switch circuit responsive to the input signal to turn on the second switching device of either the first trigger generator circuit or the second trigger generator circuit; and a second switch circuit using output signals of the flip-flop circuit provided with delays to switch on/off states of the first switching devices of the first and second trigger generator circuits complementarily to the second switching devices respectively connected in series with the first switching devices.

In the above described inverter apparatus, the step-up level shift circuit includes the flip-flop circuit disposed on the upper arm side, the set signal generator circuit, and the reset signal generator circuit. Each of the set signal generator circuit and the reset signal generator circuit includes a series connection of the voltage clamp circuit, the first switching device, and the second switching device. In response to an input signal, one of the second switching devices of the set and reset signal generator circuits is turned on by the first switch circuit disposed on the lower arm side. There is provided the second switch circuit using output signals of the flip-flop circuit provided with delays to switch on/off states of the first switching devices complementarily to the second switching devices respectively connected in series with the first switching devices. Thereby, during an interval obtained by adding the above described delay to the delay time of the flip-flop circuit, both the first switching device and the second switching device of the set side or reset side turn on. Only during this interval, a current flows from the positive side to the negative side and a set or reset trigger signal is supplied to the flip-flop circuit. After the above described interval, the first and second switching devices of the set side and reset side are in complementary states. That is to say, if the second switching device is in the on-state, the first switching device is in the off-state. On the contrary, if the second switching device is in the off-state, the first switching device is in the on-state. Therefore, no current flows through the series circuit including the first and second switching devices. Current consumption can thus be reduced.

It is now assumed that the output of the flip-flop circuit is fixed at a certain state (a high or low level) by a set or reset signal and thereafter the output logic is inverted by noise. By the function of the second switch circuit, the first switching device which was in the off-state before occurrence of noise turns on and the first switching device which was in the on-state before occurrence of noise turns off. As a result, a current flows again from the positive side to the negative side through the series circuit including the second switching device brought to the on-state by the first switch circuit and the first switching device changed to the on-state by the above described noise. A set or reset nominal trigger signal is thus applied to the flip-flop circuit. This current is hereafter referred to as re-trigger current. By the re-trigger current, the output of the flip-flop circuit can be restored to the normal logic state.

The function of the step-up level shift circuit for transmitting a signal from the lower arm side to the upper arm side has heretofore been described. By using a circuit configuration in which the lower arm side and the upper arm side of the described configuration are reversed, a step-down level shift circuit for transmitting a signal from the upper arm to the lower arm can be formed. That is to say, the step-down level shift circuit includes a second flip-flop circuit disposed on the lower arm side, a second set signal generator circuit, and a second reset signal generator circuit. Each of the second set signal generator circuit and the second reset signal generator circuit includes a series connection of a voltage clamp circuit, a third switching device, and a fourth switching device. In response to a state detection signal sensed on the upper arm side, one of the fourth switching devices of the second set and reset signal generator circuits is turned on by the third switch circuit disposed on the upper arm side. There is provided a fourth switch circuit using output signals of a second flip-flop circuit provided with delays to switch on/off states of the third switching devices complementarily to the fourth switching devices respectively connected in series with the third switching devices. Thereby, during an interval obtained by adding the above described delay to the delay time of the second flip-flop circuit, both the third switching device and the fourth switching device of the set side or reset side turn on. Only during this interval, a current flows from the positive side to the negative side and a set or reset trigger signal is supplied to the second flip-flop circuit.

In the same way as the step-up level shift circuit, therefore, the current consumption is low. At the time of false operation due to noise, the output of the second flip-flop circuit can be restored to the nominal logic by letting flow a re-trigger current.

DESCRIPTION OF THE PREFERRED EMBODIMENTS

Embodiments of an inverter apparatus according to the present invention will hereafter be described by referring to drawings.

Figure 2:
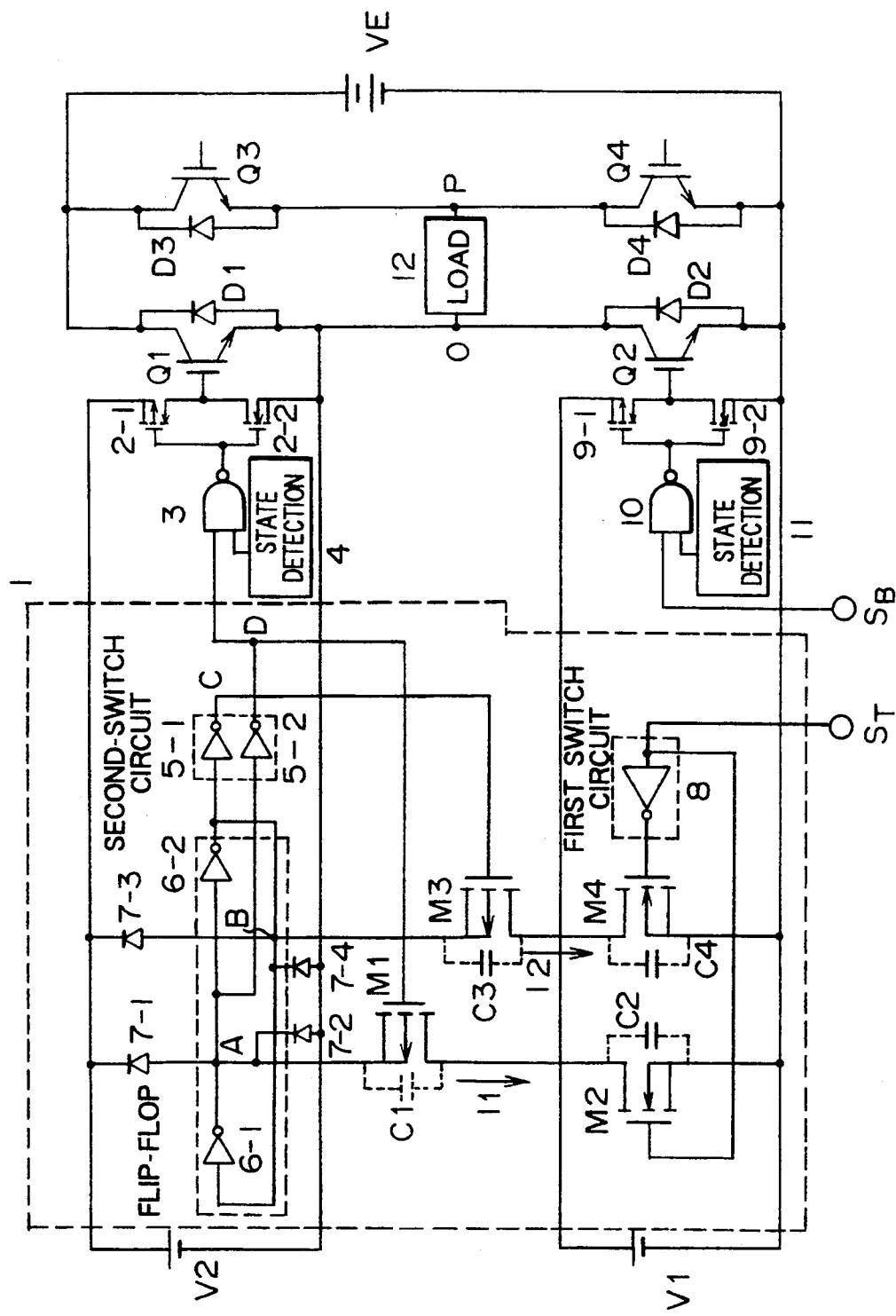
FIG. 2 is a configuration diagram showing an embodiment of an inverter apparatus using a step-up level shift circuit according to the present invention.

FIG. 2 is a configuration diagram showing a first embodiment of an inverter apparatus according to the present invention.

In FIG. 2, Q1 denotes a first power switching device which is an upper arm output stage element of a U-phase inverter. Q2 denotes a second power switching device which is a lower arm output stage element of a U-phase inverter. Q3 denotes a first power switching device which is an upper arm output stage element of a V-phase inverter. Q4 denotes a second power switching device which is a lower arm output stage element of a v-phase inverter. D1 denotes a freewheeling diode connected in parallel with Q1 of the U-phase upper arm. D2 denotes a freewheeling diode connected in parallel with Q2 of the U-phase lower arm. D3 denotes a freewheeling diode connected in parallel with Q3 of the V-phase upper arm. D4 denotes a freewheeling diode connected in parallel with Q4 of the V-phase lower arm. Between an output terminal 0 of the U phase and an output terminal P of the V phase, a load 12 is connected. Depending upon on/off states of Q1 to Q4, a current from a high voltage power source VE is supplied to the load 12.

Numeral 1 denotes a step-up level shift circuit the present invention aims at. The step-up level shift circuit 1 transmits a signal inputted from the lower arm side to a driver circuit for Q1 comprised of a P-channel MOSFET 2-1 and an N-channel MOSFET 2-2. A driver circuit for Q2 is comprised of a P-channel MOSFET 9-1 and an N-channel MOSFET 9-2. However, these use a reference potential (negative electrode potential of V1 which will be described later) which is the same as that of the drive signal of the lower arm inputted from an input terminal SB, and hence the step-up level shift circuit is not needed. Numerals 3 and 10 denote NAND circuits. Numerals 4 and 11 denote state detection circuits of the upper arm and the lower arm, respectively.

The step-up level shift circuit 1 is comprised of a flip-flop circuit using two logic inverters 6-1 and 6-2, a voltage clamping circuit using diodes 7-1 to 7-4, and high voltage devices M1, M2, M3 and M4. M1 and M3 denote P-channel MOSFETs, and M2 and M4 denote N-channel MOSFETs. M1 and M2 are connected in series. The source terminal of M1 is connected to a junction A of the output terminal of the inverter 6-1 and the input terminal of the inverter 6-2. The source terminal of M2 is connected to the negative electrode of the low voltage power source V1 of the lower arm. In the same way, M3 and M4 are connected in series. The source terminal of M3 is connected to a junction B of the output terminal of the inverter 6-2 and the input terminal of the inverter 6-1. The source terminal of M4 is connected to the negative electrode of the low voltage power source V1. C1 denotes drain-source parasitic capacitance of M1 described above. In the same way, C2 denotes drain-source parasitic capacitance of M2. C3 denotes drain-source parasitic capacitance of M3. C4 denotes drain-source parasitic capacitance of M4. Parasitic capacitance C1 to C4 are illustrated in FIG. 2 because they become important when influence of dV/dt is considered as described later.

The diodes 7-1 and 7-2 are connected in series between the positive electrode and negative electrode of a low voltage power source V2 of the upper arm. A junction of the anode of the diode 7-1 and the cathode of the diode 7-2 is connected to the point A. In the same way, the diodes 7-3 and 7-4 are connected in series between the positive electrode and negative electrode of V2. A Junction of the anode of the diode 7-3 and the cathode of the diode 7-4 is connected to the point B. Then, the output of the inverter 6-1 taken out from the point A is inputted to a logic inverter 5-2. The output of the inverter 5-2 is connected to the gate terminal of M1 and one input terminal of the above described NAND circuit 3. Furthermore, the output of the inverter 6-2 taken out from the point B is inputted to a logic inverter 5-1. The output of the inverter 5-1 is connected to the gate terminal of M3. The inverters 5-1, 5-2, 6-1 and 6-2 are provided with currents from the low voltage power source V2 of the upper arm. Output terminals of the inverters 5-1 and 5-2 are referred to as points C and D, respectively. The output signal of the inverter 5-2 and the output signal of the above described state detection circuit 4 of the upper arm are inputted to the NAND circuit 3. When these signals are at the high level with respect to the negative electrode potential of V2, the NAND circuit 3 transmits a low level signal to gate terminals of devices 2-1 and 2-2 of the driver circuit. As a result, gate voltage of a high level is applied between the gate terminal and emitter terminal of Q1, thereby turning Q1 on. In the same way, the signal inputted from the input terminal SB and the output signal of the above described state detection circuit 11 of the lower arm are inputted to the NAND circuit 10. When these signals are at the high level with respect to the negative electrode potential of V1, the NAND circuit 10 transmits a low level signal to gate terminals of devices 9-1 and 9-2 of the driver circuit. As a result, gate voltage of a high level is applied between the gate terminal and emitter terminal of Q2, thereby turning Q2 on. A signal voltage inputted from an input terminal ST is applied to the gate terminal of M2. The signal voltage inputted from the input terminal ST is inputted to the gate terminal of M4 via a logic inverter 8.

The logic inverter 8 turns either M2 or M4 on depending upon the signal voltage inputted from ST. From this function, the logic inverter 8 is hereafter referred to as a first switch circuit. The inverters 5-1 and 5-2 invert logics of signals taken out respectively from two output terminals (points A and B) of the flip-flop circuit comprised of inverters 6-1 and 6-2, and transmit those signals to gate terminals of M3 and M1 after slight delays, respectively. From the function, 5-1 and 5-2 are hereafter referred to as a second switch circuit.

Two output terminals (points A and B) of the flip-flop circuit are also terminals which input a set signal and a reset signal for fixing the output logic of the flip-flop circuit, respectively. Hereafter, the points A and B are referred to as set terminal and reset terminal, respectively. Thereby, a series circuit comprised of the diodes 7-1 and 7-2 and the devices M1 and M2 serves as a set signal generator circuit for supplying a trigger signal (a voltage signal of a low level with respect to the negative electrode of V2) to the above described set terminal. A current flowing through this series circuit is hereafter referred to as I1. In the same way, a series circuit comprised of the diodes 7-3 and 7-4 and the devices M3 and M4 serves as a reset signal generator circuit for supplying a trigger signal to the above described reset terminal. A current flowing through this series circuit is hereafter referred to as I2.

Operation of the step-up level shift circuit, which is used in the inverter apparatus configured as described above and which is the aim of the present invention, will now be described by referring to FIG. 3.

Figure 3:
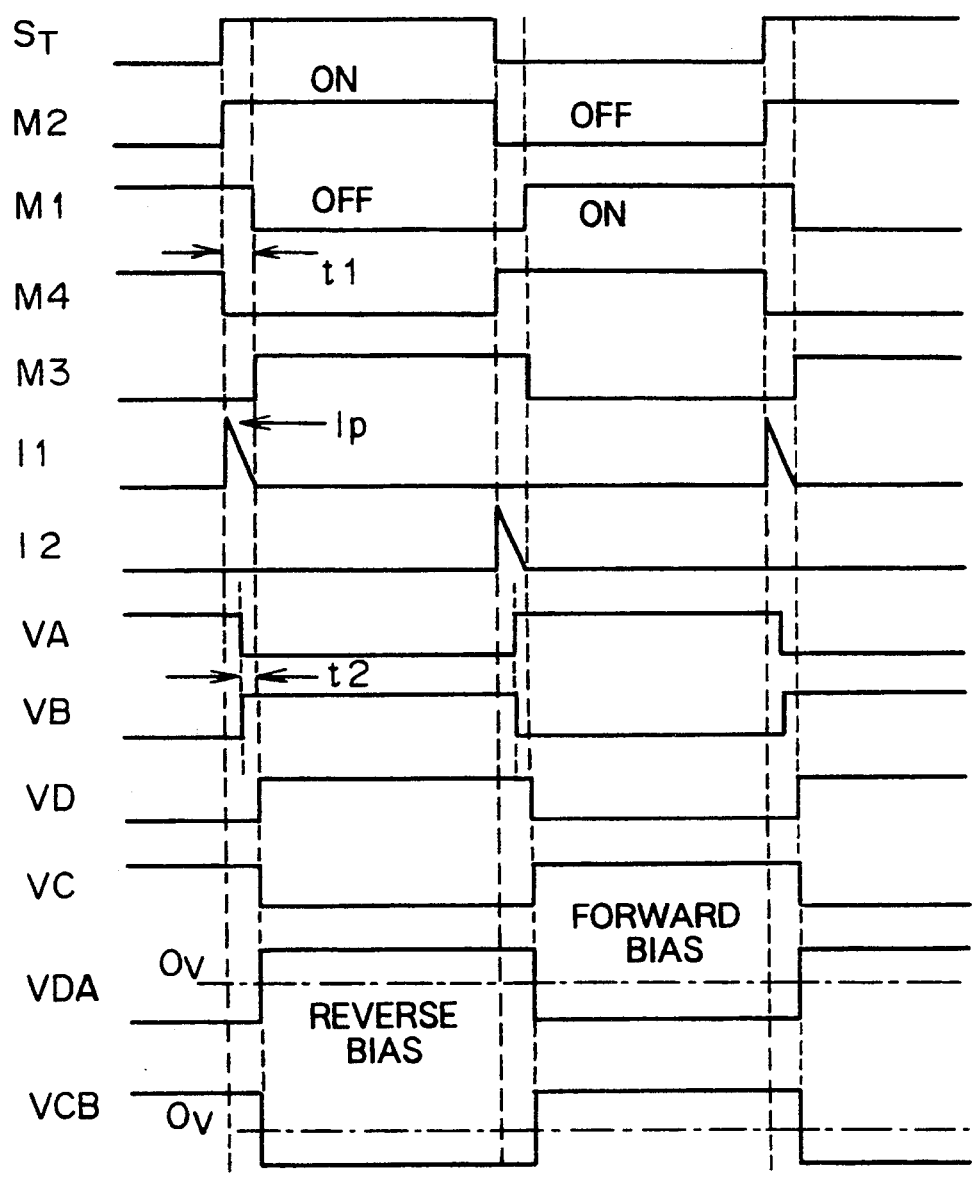
FIG. 3 is a time chart illustrating the operation of the step-up level shift circuit of FIG. 2.

FIG. 3 is a diagram illustrating the operation of the step-up level shift circuit shown in FIG. 2. In FIG. 3, ST denotes an input signal inputted to the input terminal of FIG. 2. M1 to M4 correspond to respective MOSFETs of FIG. 2. M1 to M4 illustrated in FIG. 3 show change of on/off states with time in a logical form. I1 and I2 denote changes of currents flowing through series circuits of the set signal generator circuit and the reset signal generator circuit, respectively. VA, VB, VC and VD denote temporal changes of voltages of the points A, B, C and D of FIG. 2 with respect to the negative electrode potential of the low voltage power source V2 of the upper arm, respectively. Furthermore, VDA denotes potential difference of the point D with respect to the point A, and it corresponds to the change of voltage between the source terminal and the gate terminal of M1 (hereafter referred to as gate voltage) with time. In the same way, VCB denotes potential difference of the point C with respect to the point B, and it corresponds to the change of the gate voltage of M3 with time. M1 and M3 are P-channel MOSFETs. When VDA or VCB is lower than 0 V, therefore, the gate terminal is in the forward bias state, thereby turning M1 or M3 on. When VDA or VCB is higher than 0 V, therefore, the gate terminal is in the reverse bias state, thereby turning M1 or M3 off.

With reference to FIG. 3, when the input signal ST becomes a high level, M2 receiving this signal at the gate terminal thereof turns on and M4 receiving the signal ST at the gate terminal thereof via the inverter 8 of the first switch circuit turns off. At this time, M1 remains in the on-state as it was before ST has become a high level. On the contrary, M3 was in the off-state before ST has become a high level. (The reason why M1 is in the on-state and M3 is in the off-state will be described later.) As a result, both M1 and M2 connected in series are in the on-state, and hence the current I1 flows through the devices M1 and M2. The current I1 is a large current at short circuit condition which flows when the voltage value obtained by adding the voltage V2 of the low voltage power source of the upper arm to the voltage VO at point 0 is short-circuited by M1 and M2. The value of the current I1 is limited by the value of a smaller one of saturation currents of M1 and M2. VO changes according to the operation of Q1 and Q2 of the inverter. The value of I1 also depends upon VO.

On the other hand, both M3 and M4 connected in series are in the off-state. Therefore, no current flows through M3 and M4. The current I1 draws the point A to the negative side with respect to the reference potential, thereby VA becoming a low level of 0 V. When VA becomes lower than 0 V and reaches approximately −0.7 V, the diode 7-2 conducts and from this time on I1 flows through the diode 7-2. That is to say, the diode 7-2 clamps the voltage of the point A. When VA becomes the low level, VB connected to VA via the logic inverter 6-2 becomes a high level according to the operation principle of the logic inverter. The voltage of VB becomes equivalent to the voltage of the power source V2. When the input signal VA becomes the low level, the output voltage VD of the logic inverter 5-2 becomes a high level with slight delay time after the change of VA. This delay time is represented by t2. The time t2 is delay time from application of the input signal to the inverter 5-2 until the state of the output voltage is fixed. The delay time t2 is as short as approximately several tens ns. In the same way, it is now assumed that the output voltage VC of the logic inverter 5-1 is fixed at the low level state when the delay time t2 has elapsed since the input signal VB became the high level.

In keeping with the above described change, the gate voltage VDA of M1 changes from the forward bias voltage of approximately −V2 to the reverse bias voltage of +V2, thereby turning M1 off. In contrast with this, VCB, which represents the change of the gate voltage of M3 with time, changes from the reverse bias voltage of approximately +V2 to the forward bias voltage of −V2, thereby turning M3 on. As a result, the current I1 flowing through M1 and M2 is cut off. Although M3 turns on, M4 connected in series with M3 is in the off-state. Therefore, no current flows through M3 and M4. The time elapsing since ST became the high level until the current I1 is cut off is represented by t1. The time t1 is equivalent to the sum of the delay time of M1 and M2 and the above described t2. The time t1 is as short as approximately 0.1 μs. Even after the current I1 is cut off, voltages of the points A to D are maintained by the flip-flop function of the inverters 6-1 and 6-2. As a result, the off-state of M1 and the on-state of M3 do not change.

When ST has changed from the high level to the low level, M2 turns off and M4 turns on. At this time, M1 is in the off-state and M3 is in the on-state as described above. As a result, both M1 and M2 connected in series are in the off-state. Therefore, no current flows through M1 and M2. On the other hand, both M3 and M4 connected in series are in the on-state. Therefore, a current I2 flows through M3 and M4. In the same way as the above described I1, the current I2 is a large current at short circuit condition which flows when the voltage value obtained by adding the voltage V2 of the low voltage power source of the upper arm to VO is short-circuited by M3 and M4. The value of the current I2 is limited by the value of a smaller one of saturation currents of M3 and M4. The value of I2 also depends upon VO.

The current I2 draws the point B to the negative side with respect to the reference potential, thereby VB becoming a low level of 0 V. When VB becomes lower than 0 V and reaches approximately −0.7 V, the diode 7-4 conducts and from this time on I2 flows through the diode 7-4. The diode 7-4 clamps the voltage of the point B. When VB becomes the low level, VA connected to VB via the logic inverter 6-1 becomes a high level. When the input signal VA becomes the high level, the output voltage VD of the logic inverter 5-2 becomes a low level with the delay time t2. In the same way, it is now assumed that the output voltage VC Of the logic inverter 5-1 is fixed at the high level state when the delay time t2 has elapsed since the input signal VB became the low level.

In keeping with the above described change, the gate voltage VDA of M1 changes from the reverse bias voltage of approximately +V2 to the forward bias voltage of −V2, thereby turning M1 on. In contrast with this, VCB, which is the gate voltage of M3, changes from the forward bias voltage of approximately −V2 to the reverse bias voltage of +V2, thereby turning M3 off. As a result, the current I2 flowing through M3 and M4 is cut off. Although M1 turns on, M2 is in the off-state. Therefore, no current flows through M1 and M2. In the same way as I1, the time elapsing since ST became the low level until the current I2 is cut off is approximately t1 (approximately 0.1 μs). Even after the current I2 is cut off, voltages of the points A to D are maintained by the flip-flop function of the inverters 6-1 and 6-2. As a result, the on-state of M1 and the off-state of M3 do not change.

In the step-up level shift circuit according to the present invention, each of the currents I1 and I2 flowing from the high-voltage side to the low-voltage side flows during the interval t1, which is approximately 0.1 μs, in one period of ST. A lower power consumption can thus be attained. Furthermore, since each of the set and reset trigger currents is the large current at short circuit condition obtained when the voltage (VO+V2) is short-circuited by M1 and M2, or M3 and M4, the value is large enough to change the state of the logic inverter 6-2 or 6-1 at high speed, resulting in a quicker response of signal transmission.

When the input signal ST becomes the high level, the point A at the output of the flip-flop disposed on the upper arm side changes to the low level on the basis of the operation principle shown in FIG. 3. As a result of inversion, in the inverter 5-2, of the logic at the point A, the point D becomes the high level. The point D is one input to the NAND circuit 3 shown in FIG. 2. If the signal supplied from the state detection circuit 4 of the upper arm side to the NAND circuit is at a high level, therefore, the voltage V2 of the low voltage power source of the upper arm is applied between the gate terminal and the emitter terminal of Q1, thereby Q1 being turned on. As a result, the voltage VO at the point 0 rises above. If the rate of its voltage change dV/dt is large, however, noise currents flow through the step-up level shift circuit. A method of avoiding the influence of this noise will now be described by referring to FIG. 4.

Figure 4:
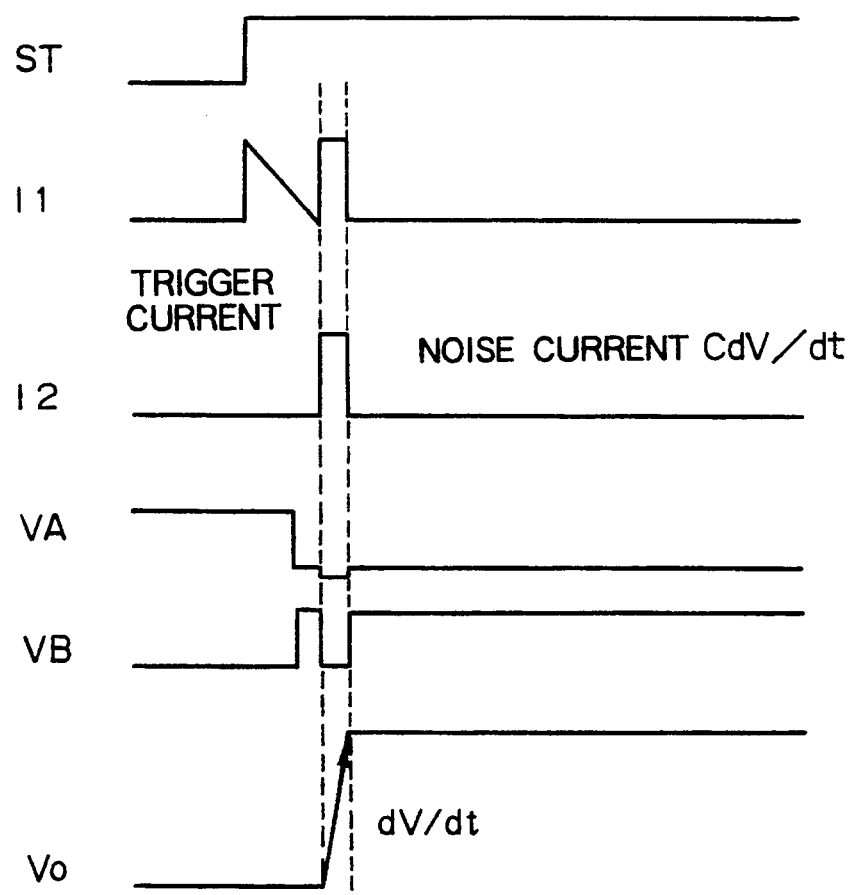
FIG. 4 is a time chart illustrating the influence of dV/dt on the step-up level shift circuit of FIG. 2 and a countermeasure thereof.

FIG. 4 is a diagram for describing the influence of dV/dt on the step-up level shift circuit according to the present invention. Characters ST, I1, I2, VA and VB used in FIG. 4 are defined as described by referring to FIG. 3. VO denotes output voltage of the U-phase inverter with respect to the potential of the negative electrode of the low voltage power source V1 of the lower arm taken as the reference potential.

When ST has become the high level, VA changes to the low level and VB changes to the high level as described before. In a range of delay time t2 immediately after VA has changed to the low level, the state of VD is not yet fixed at the high level and hence Q1 does not turn on. Assuming that the value of VO up to this time is approximately 0 V, it should be noted that the value of the current I1 depends upon V0 as described above. Under the condition that VO is approximately 0 V, it is conceivable that the drain voltage of M1 and M2 is low and they are not saturated even if M1 and M2 turn on. For activating the flip-flop by I1 even under such a condition, it is necessary to make the on-resistance of M1 and M2 sufficiently small to make the value of the current flowing through M1 and M2 large. As for the method for making the on-resistance of M1 and M2, it is typical that the area (or W/L where W is gate width and L is gate length) of each of these devices is made large. In contrast with the current I1, Q1 is in the on-state and the value of VO is equal to the voltage of the high voltage power source VE when the current I2 flows. Therefore, the devices M3 and M4 letting flow the current I2 obtain sufficiently high drain voltage and saturate. A smaller one of the saturation currents of M3 and M4 flows as I2. Therefore, devices M3 and M4 may be approximately ⅓ to ½ in W/L as compared with M1 and M2.

If a signal is transmitted to 2-1 of the driver circuit of the upper arm by the step-up level shift circuit and thereby Q1 is turned on, VO abruptly rises from the above described approximately 0 V and reaches the voltage of the high voltage power source VE. At this time, a noise current, which is determined by the rate dV/dt of voltage change of VO and the parasitic capacitance shown in FIG. 2, flows through each of series connection of M1 and M2 and series connection of M3 and M4. The noise current flowing through the series connection of M1 and M2 is a current for charging the parasitic capacitance C1 of M1 which is in the off-state, and the noise current has magnitude determined by C1 and dV/dt. The noise current flowing through the series connection of M3 and M4 is a current for charging the parasitic capacitance C4 of M4 which is in the off-state, and the noise current has magnitude determined by C4 and dV/dt. Both currents flow in the direction indicated by arrows in FIG. 2, i.e., in the direction pointing from the high voltage side to the low voltage side.

By these noise currents, VA and VB are drawn to the negative side. VB changes from the high level to the low level. However, VA is already at the low level before the occurrence of the noise current, resulting in no change of logic. Furthermore, it is also conceivable that the influence of the change of VB to the low level appears at the point A via the inverter 6-1. However, M1 and M2 of the set side are larger than M3 and M4 of the reset side in device area or W/L and hence in parasitic capacitance value as well. Even if the influence of the change of VB to the low level attempts to appear at the point A via the inverter 6-1, therefore, the point A is affected by a noise current larger than that of the point B and drawn to the negative side and hence the logic of the point A is not inverted. Influence of dV/dt is exerted during slight transition (approximately 0.1 μs) for turning Q1 on. If the logic of the point A is not inverted during this interval, therefore, the point B can return to the normal state of the high level again according to the logic of the point A after the noise current has disappeared.

As heretofore described, there is a feature that the logic of the point B of the flip-flop circuit is inverted by the noise current whereas the logic of the point B is not inverted. Therefore, it is important that the signal transmitted to the devices 2-1 and 2-1 of the driver circuit is taken out from the point A which is not affected by the noise current caused by dV/dt.

Influence of the noise caused when the output voltage of the inverter changes and a measure to count the influence have heretofore been described. A measure to count direct inversion of the output logic of the flip-flop caused by unspecific noise will now be described.

Figure 5:
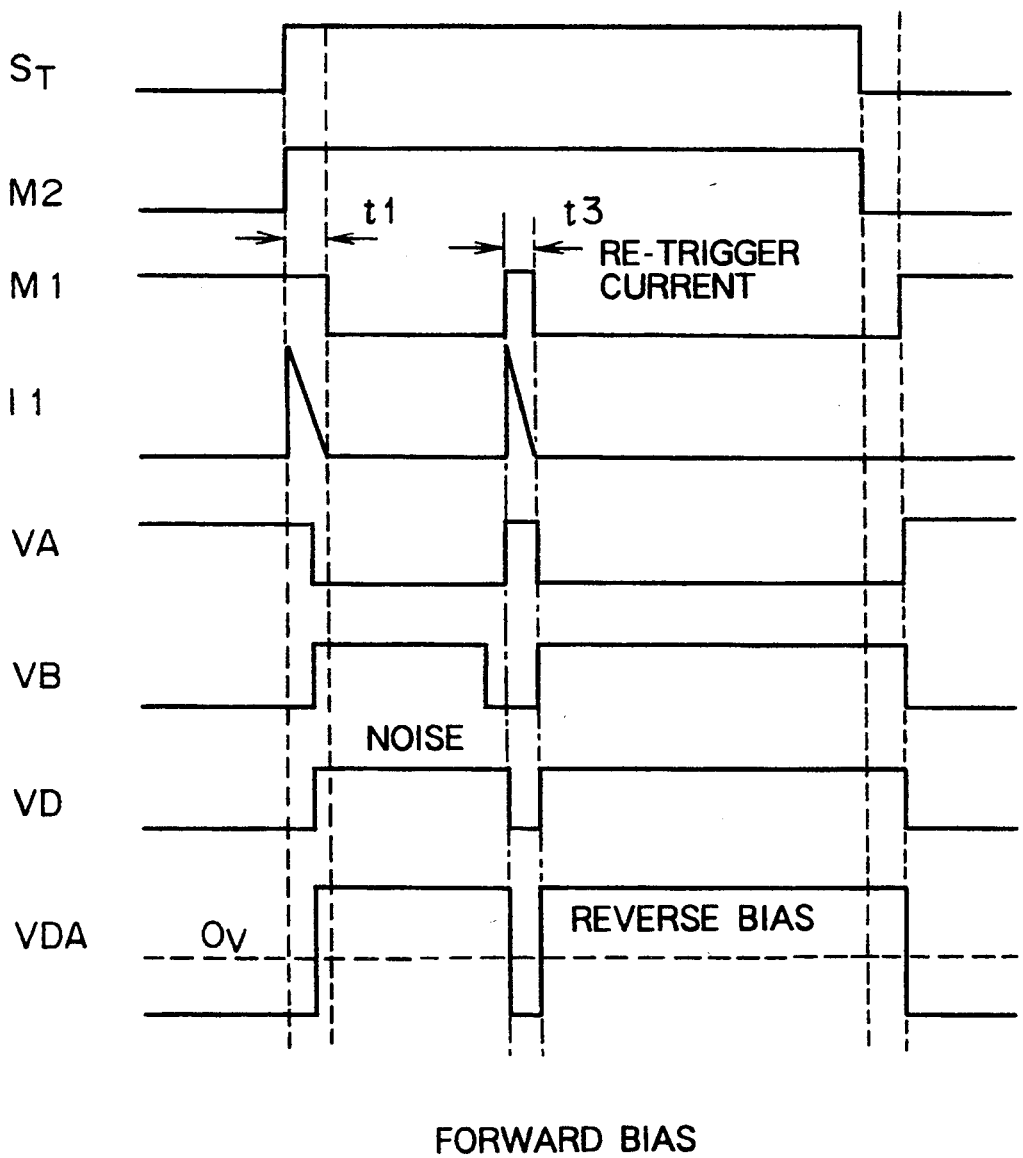
FIG. 5 is a time chart illustrating retrigger function of the step-up level shift circuit of FIG. 2.

FIG. 5 is a diagram illustrating re-trigger function at the time of false operation caused by noise, which is the greatest feature of the step-up level shift circuit according to the present invention. Definition of characters of FIG. 5 is the same as that of FIG. 3. Therefore, duplicate description will be omitted.

When ST becomes a high level in FIG. 5, VA becomes a low level; VB becomes a high level; VD becomes a high level; and VDA which is the gate voltage of M1 is reverse biased according to the above described operation. If VB changes from the high level to the low level under the influence of noise as illustrated, this influence appears at the point A via the inverter 6-1, thereby the point being changed from the low level to the high level.

In keeping with this, VD changes to the low level and VDA changes into a forward bias state. As a result, M1 which has been in the off-state changes into the on-state. Since both M1 and M2 are in the on-state, the current I1 flows again. As described before, this current functions to provide the flip-flop circuit comprised of 6-1 and 6-2 with the set trigger signal again. Therefore, this current can be called re-trigger current. When the re-trigger current flows, the operation after flow of I1 illustrated in FIG. 3 reappear. The outputs VA and VB of the flip-flop, and VD and VC obtained by inverting them in the second switch circuit (logic inverter) can return to the normal logic state determined by ST in the same way as FIG. 3. In this way, the step-up level shift circuit according to the present invention has a feature that even when the output logic of the flip-flop is directly inverted, the re-trigger current is immediately let flow to return the output logic to the normal state. The step-up level shift circuit according to the present invention is suitable for an inverter apparatus susceptible to influences of noise.

As for the embodiment of FIG. 2, the step-up level shift circuit 1 is provided for driving the output stage device Q1 of the U-phase upper arm as illustrated. For driving the output stage device Q3 of the V-phase upper arm, a step-up level shift circuit having the same configuration as that of the circuit 1 is separately needed. In FIG. 2, the level shift circuit for the V phase is omitted.

The step-down level shift circuit for transmitting a state detection signal sensed in the upper arm to the lower arm will now be described.

Figure 6:
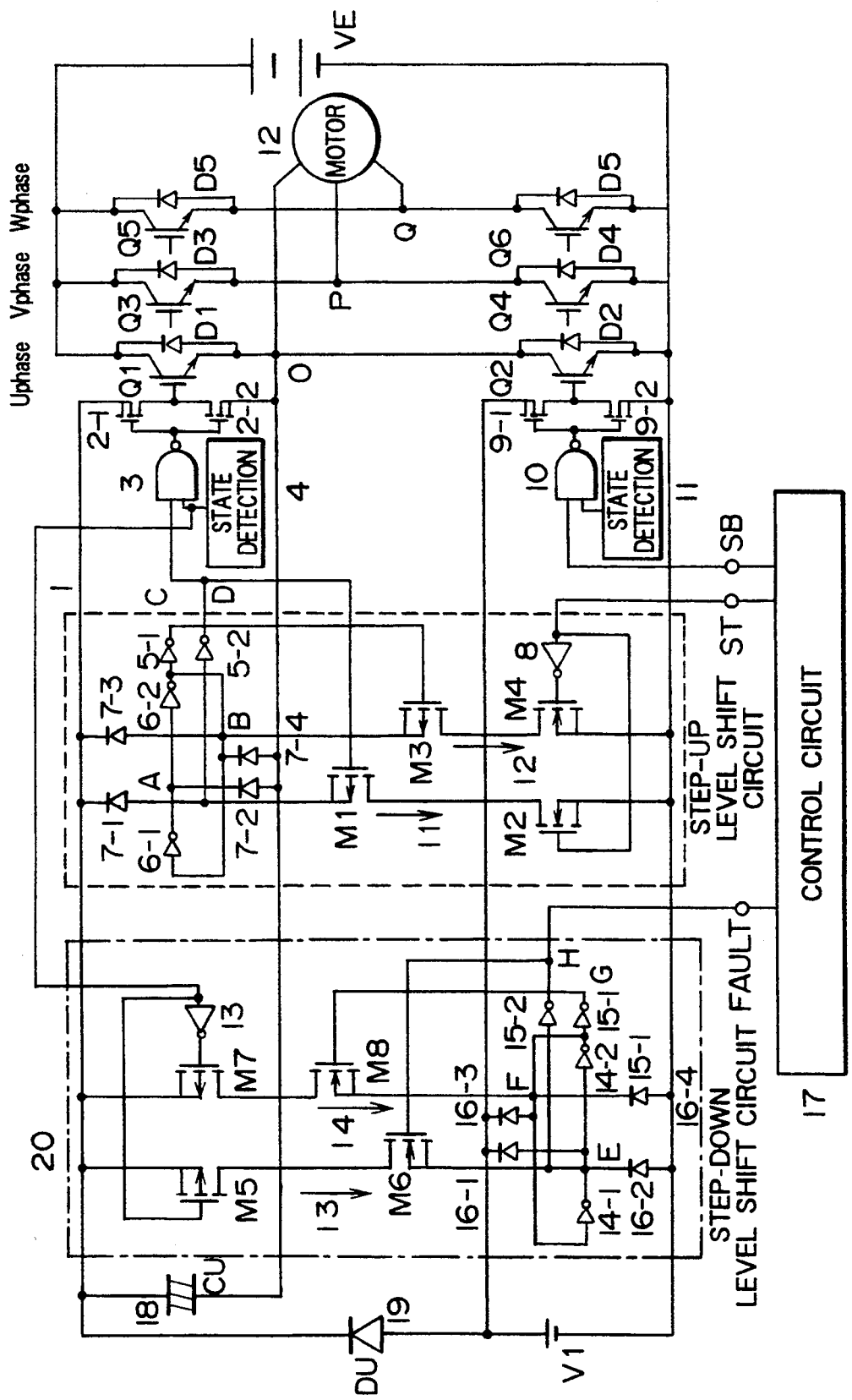
FIG. 6 is a configuration diagram showing another embodiment of an inverter apparatus using a step-down level shift circuit according to the present invention.

FIG. 6 is a configuration diagram showing a second embodiment of an inverter apparatus according to the present invention. In the ensuing description, components having the same functions as those of the embodiment shown in FIG. 2 are denoted by like characters. Duplicate description of them will be omitted.

In FIG. 6, output stage devices Q1 and Q2 of a U-phase inverter, freewheeling diodes D1 and D2 for Q1 and Q2, output stage devices Q3 and Q4 of a V-phase inverter, and freewheeling diodes D3 and D4 for Q3 and Q4 are the same as those of the embodiment of FIG. 2. In addition to them, the present embodiment has Q5 as a first power switching device which is the output stage device of the upper arm of a W-phase inverter and Q6 as a second power switching device which is the output stage device of the lower arm of the W-phase inverter. D5 denotes a freewheeling diode connected in parallel to Q5. D6 denotes a freewheeling diode connected in parallel to Q6. In addition to the output terminal 0 of the U phase and the output terminal P of the V phase described with reference to FIG. 2, an output terminal Q of the W phase is provided. The output terminals 0, P and Q are connected to a load motor 12.

In FIG. 6, a P-channel MOSFET 2-1 and an N-channel MOSFET 2-2 of a driver circuit for Q1, a P-channel MOSFET 9-1 and an N-channel MOSFET 9-2 of a driver circuit for Q2, NAND circuits 3 and 10, state detection circuits 4 and 11 respectively of the upper arm and the lower arm, and a step-up level shift circuit 1 are the same as those of the configuration shown in FIG. 2.

A step-down level shift circuit 20 includes a second flip-flop circuit using two logic inverters 14-1 and 14-2, a voltage clamping circuit using diodes 16-1 to 16-4, and high voltage devices M5, M6, M7 and MS. Among them, M5 and M7 denote P-channel MOSFETs and M6 and M8 denote N-channel MOSFETs. M5 and M6 are connected in series. The source terminal of M6 is connected to a junction point E of an output terminal of the inverter 14-1 and an input terminal of the inverter 14-2. The source terminal of M5 is connected to a positive electrode of a capacitor (hereafter referred to as CU) 18 serving as a low voltage power source of the upper arm side. In the same way, M7 and M8 are connected in series. The source terminal of M8 is connected to a junction point F of an output terminal of the inverter 14-2 and an input terminal of the inverter 14-1. The source terminal of M7 is connected to a positive electrode of the above described CU.

The diodes 16-1 and 16-2 are connected in series between the positive electrode and negative electrode of a low voltage power source V1 of the lower arm side. The junction of the anode of 16-1 and the cathode of 16-2 is connected to the above described point E. In the same way, the diodes 16-3 and 16-4 are connected in series between the positive electrode and negative electrode of V1. The junction of the anode of 16-3 and the cathode of 16-4 is connected to the above described point F. The output of the inverter 14-1 taken out from the point E is inputted to a logic inverter 15-2 which is a fourth switch circuit of the set side. The output of the inverter 15-2 is connected to the gate terminal of M6. Furthermore, the output of the inverter 14-2 taken out from the point F is inputted to a logic inverter 15-1 which is a fourth switch circuit of the reset side. The output of the inverter 15-1 is connected to the gate terminal of M8. A current is supplied from the low voltage power source V1 of the lower arm to each of the inverters 14-1 and 14-2 and the inverters 15-1 and 15-2. Output terminals of the inverters 15-1 and 15-2 are hereafter referred to as points G and H, respectively. The output signal of the above described state detection circuit 4 of the upper arm is connected to the gate terminal of M5, and is further connected to the gate terminal of M7 via a logic inverter 13 which is a third switch circuit.

A control circuit 17 is connected to the step-up level shift circuit 1 via an input terminal ST and is connected to a NAND circuit 10 of the lower arm via an input terminal SB. The control circuit 17 thus outputs control signals for turning output stage devices on and off to the driver circuits of the upper arm and lower arm of the U phase. A terminal FAULT connecting the point H of the step-down level shift circuit with the control circuit 17 is an output terminal for outputting a state detection signal indicating an abnormality sensed by the state detection circuit of the upper arm to the control circuit 17.

Figure 1:
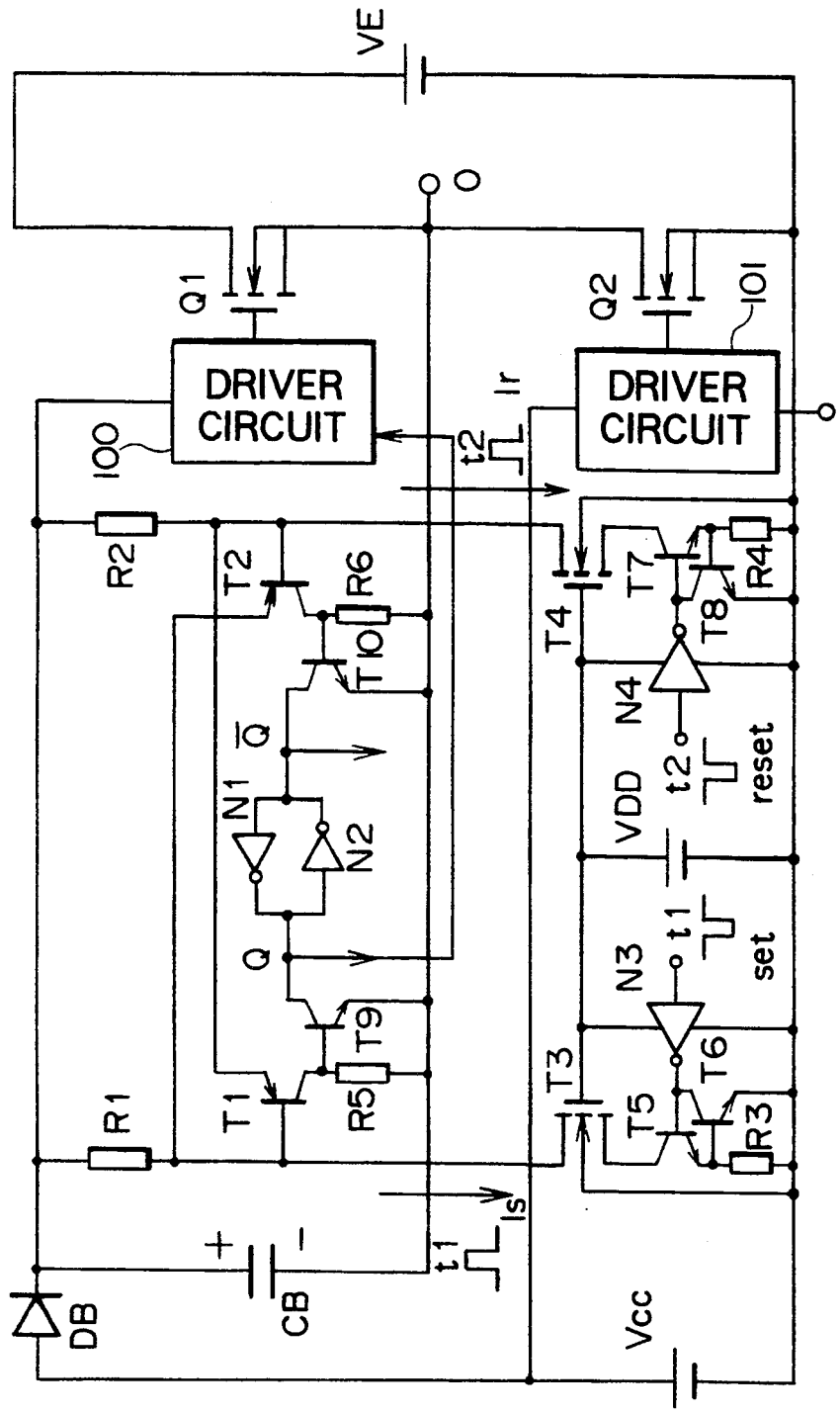
FIG. 1 is a configuration diagram of an inverter apparatus having a conventional level shift circuit.

When Q2 turns on, CU and a diode (hereafter referred to as DU) 19 let flow a current from V1 through series connection of DU, CU and Q2 to charge CU. CU and DU have the same function as that of CB and DB included in the conventional level shift circuit shown in FIG. 1 described above.

A series circuit comprised of the diodes 16-1 and 16-2 and the devices M5 and M6 serves as a set signal generator circuit for supplying a trigger signal (a voltage signal of a high level with respect to the negative electrode of V1) to a set terminal (the point E) of the second flip-flop circuit. A current flowing through this series circuit is hereafter referred to as I3. In the same way, a series circuit comprised of the diodes 16-3 and 16-4 and the devices M7 and M8 serves as a reset signal generator circuit for supplying a trigger signal to a reset terminal (the point F) of the second flip-flop circuit. A current flowing through this series circuit is hereafter referred to as I4.

Operation of the step-down level shift circuit, which is used in the inverter apparatus configured as described above and which is the aim of the present invention, will now be described by referring to FIG. 7.

Figure 7:
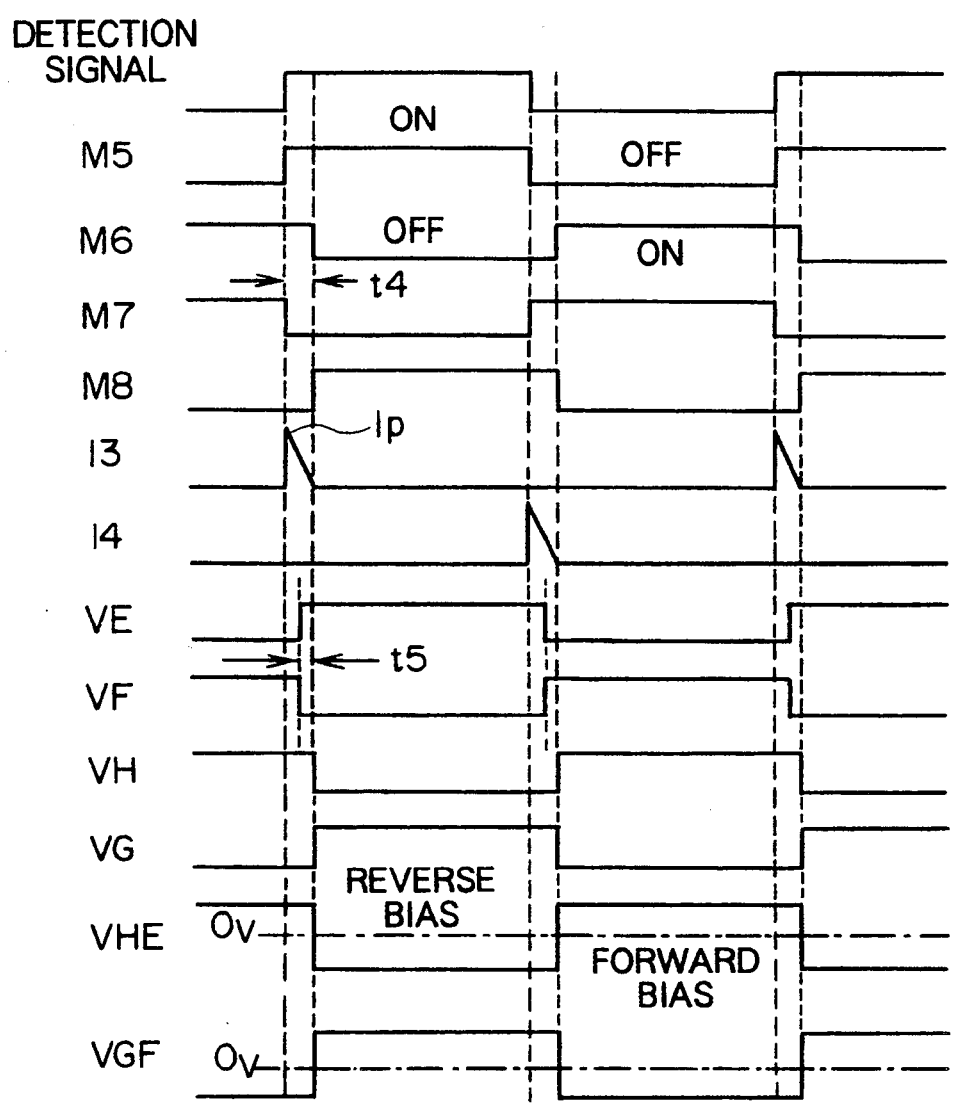
FIG. 7 is a time chart illustrating operation of the step-down level shift circuit of FIG. 6.

FIG. 7 is a diagram illustrating the operation of only the step-down level shift circuit 20 shown in FIG. 6. In FIG. 7, the state detection signal is a signal indicating an abnormality sensed by the state detection circuit 4 of the upper arm shown in FIG. 6. When the state detection signal is at a low level (approximately 0 V) with respect to the negative electrode potential of CU, it indicates an abnormality. M5 to M8 correspond to respective MOS-FETs of FIG. 5- In the same way as FIG. 3, M5 to M8 show change of on/off states with time in a logical form. I3 and I4 denote changes of currents flowing through series circuits of the set signal generator circuit and the reset signal generator circuit, respectively. VE, VF, VG and VH denote temporal changes of voltages of the points E, F, G and H of FIG. 6 with respect to the negative electrode potential of the low voltage power source V1 of the lower arm, respectively. Furthermore, VHE denotes potential difference of the point H with respect to the point E, and it corresponds to the change of gate voltage applied between the gate terminal and the source terminal of M6 with time. In the same way, VGF denotes potential difference of the point G with respect to the point F, and it corresponds to the change of the gate voltage of M8 with time. M6 and M8 are N-channel MOSFETs. When VHE or VGF is higher than 0 V, therefore, the gate terminal is in the forward bias state, thereby turning M6 or M8 on. When VHE or VGF is lower than 0 V, therefore, the gate terminal is in the reverse bias state, thereby turning M6 or M8 off.

With reference to FIG. 7, when the state detection signal becomes a low level, M5 receiving this signal at the gate terminal thereof turns on and M7 receiving the state detection signal at the gate terminal thereof via the inverter 13 of the third switch circuit turns off. At this time, M6 remains in the on-state as it was before the state detection signal has become a low level. On the contrary, M8 was in the off-state before the state detection signal has become a low level. As a result, both M5 and M6 connected in series are in the on-state, and hence the current I3 flows through the devices M5 and M6. The current I3 is a large current at short circuit condition which flows when the voltage value obtained by adding the charging voltage VCU of CU of the upper arm to the voltage VO at point 0 is short-circuited by M5 and M6. The value of the current I3 is limited by the value of a smaller one of saturation currents of M5 and M6. The value of I3 depends upon VO.

Both M7 and M8 connected in series are in the off-state. Therefore, no current flows through M7 and M8. The current I3 flows from the output terminal of the logic inverter 14-2 into a GND line (a negative electrode potential of V1). By its voltage drop, the current I3 draws up the point E to the positive side with respect to the reference potential, thereby VE becoming a high level equivalent to the power source voltage (V1) of V1. When VE increases in excess of the value of V1, the diode 16-1 conducts and from this time on I3 flows through the diode 16-1, thereby clamping the voltage of the point E. When VE becomes the high level, VF connected to VE via the logic inverter 14-2 becomes a low level. The voltage of VF becomes equivalent to approximately 0 V.

When VE becomes the high level, the output voltage VH of the logic inverter 15-2 becomes a low level with slight delay time after the change of VE. This delay time is represented by t5. The time t5 is delay time from application of the input signal to the inverter 15-2 until the state of the output voltage is fixed. The delay time t5 is as short as approximately several ten ns. In the same way, it is now assumed that the output voltage VG of the logic inverter 15-1 is fixed at the high level state when the delay time t5 has elapsed since the input signal VB became a high level.

In keeping with the above described change, the gate voltage VHE of M6 changes from the forward bias voltage of approximately +V1 to the reverse bias voltage of −V1, thereby turning M6 off. In contrast with this, VGF, which represents the change of the gate voltage of M8 with time, changes from the reverse bias voltage of approximately −V1 to the forward bias voltage of +V1, thereby turning M8 on. As a result, the current I3 flowing through M5 and M6 is cut off. Although M8 turns on, M7 connected in series with M8 is in the off-state. Therefore, no current flows through M7 and M8. The time elapsing since the state detection signal became the low level until the current I3 is cut off is represented by t4. The time t4 is equivalent to the sum of the delay time of M5 and M6 and the above described t5. The time t4 is as short as approximately 0.1 μs. Even after the current I3 is cut off, voltages of the points E to H are maintained by the flip-flop function of the inverters 14-1 and 14-2. As a result, the off-state of M6 and the on-state of M8 do not change.

When the state detection signal has changed from the low level to the high level, M5 turns off and M7 turns on. At this time, M6 is in the off-state and M8 is in the on-state as described above. As a result, both M5 and M6 connected in series are in the off-state. Therefore, no current flows through M5 and M6. On the other hand, both M7 and M8 connected in series are in the on-state. Therefore, a current I4 flows through M7 and M8. In the same way as the above described I3, the current I4 is a large current at short circuit condition which flows when the voltage value obtained by adding the voltage V1 of the low voltage power source of the lower arm to VO is short-circuited by M7 and M8. The value of the current I4 is limited by the value of a smaller one of saturation currents of M7 and M8. In the same way as I3, the value of I4 depends upon VO.

The current I4 flows from the output terminal of the logic inverter 14-1 into the GND line. By its voltage drop, the current I4 draws up the point F to the positive side with respect to the reference potential, thereby VF becoming a high level.

When VF increases in excess of the value of V1, the diode 16-3 conducts and from this time on I4 flows through the diode 16-3, thereby clamping the voltage of the point F to the value of V1+0.7 V. When VF becomes the high level, VE connected to VF via the logic inverter 14-1 becomes a low level. The voltage of VE becomes equivalent to approximately 0 V. When VE becomes the low level, the output voltage VH of the logic inverter 15-2 becomes a high level with the delay time t5 after the change of VE. In the same way, the output voltage VG of the logic inverter 15-1 becomes the low level when the delay time t5 has elapsed since VF became the high level.

In keeping with the above described change, the gate voltage VHE of M6 changes from the reverse bias voltage of approximately −V1 to the forward bias voltage of +V1, thereby turning M6 on. In contrast with this, the gate voltage VGF of M8 changes from the forward bias voltage of approximately +V1 to the reverse bias voltage of −V1, thereby turning M8 off. As a result, the current I4 flowing through M7 and M8 is cut off. Even after the current I4 is cut off, voltages of the points E to H are maintained by the flip-flop function of the inverters 14-1 and 14-2. As a result, the on-state of M6 and the off-state of M8 do not change.

In the step-down level shift circuit 20 according to the present invention, each of the currents I3 and I4 flowing from the high-voltage side to the low-voltage side flows during the interval t4, which is approximately 0.1 μs, each time the state detection signal is transmitted. A lower power consumption can thus be attained. Furthermore, since each of the set and reset trigger currents is the overcurrent at short circuit condition obtained when the voltage (V0+V1) is short-circuited by M5 and M6, or M7 and MS, the value is large enough to change the state of the logic inverter 14-2 or 14-1 at high speed, resulting in a quicker response of signal transmission. When the output logic of the second flip-flop circuit has been inverted by false operation due to noise, the step-down level shift circuit 20 according to the present invention can let flow a re-trigger current for restoring it to the normal logic in the same way as the step-up level shift circuit 1 although description will be omitted. This is effective in achieving higher reliability of an inverter apparatus.

Both the step-up level shift circuit 1 and the step-down level shift circuit 20 according to the present invention heretofore described are low in current consumption. Each of them has a feature that a large current can be let flow at the time of signal transmission to quicken the response of signal transmission. Furthermore, each of them has a feature that false operation due to noise is prevented. A voltage exceeding the output voltage Vo of the inverter is applied to each level shift circuit. Since the current consumption has been reduced, the loss is very small. By making the most of this feature of low loss, each of the level shift circuit can be implemented as an integrated circuit (IC). By adoption of ICs, the number of components can be reduced significantly. The level shift circuits can be housed into one package together with the output stage devices of the inverter or the driver circuits.

Figure 8:
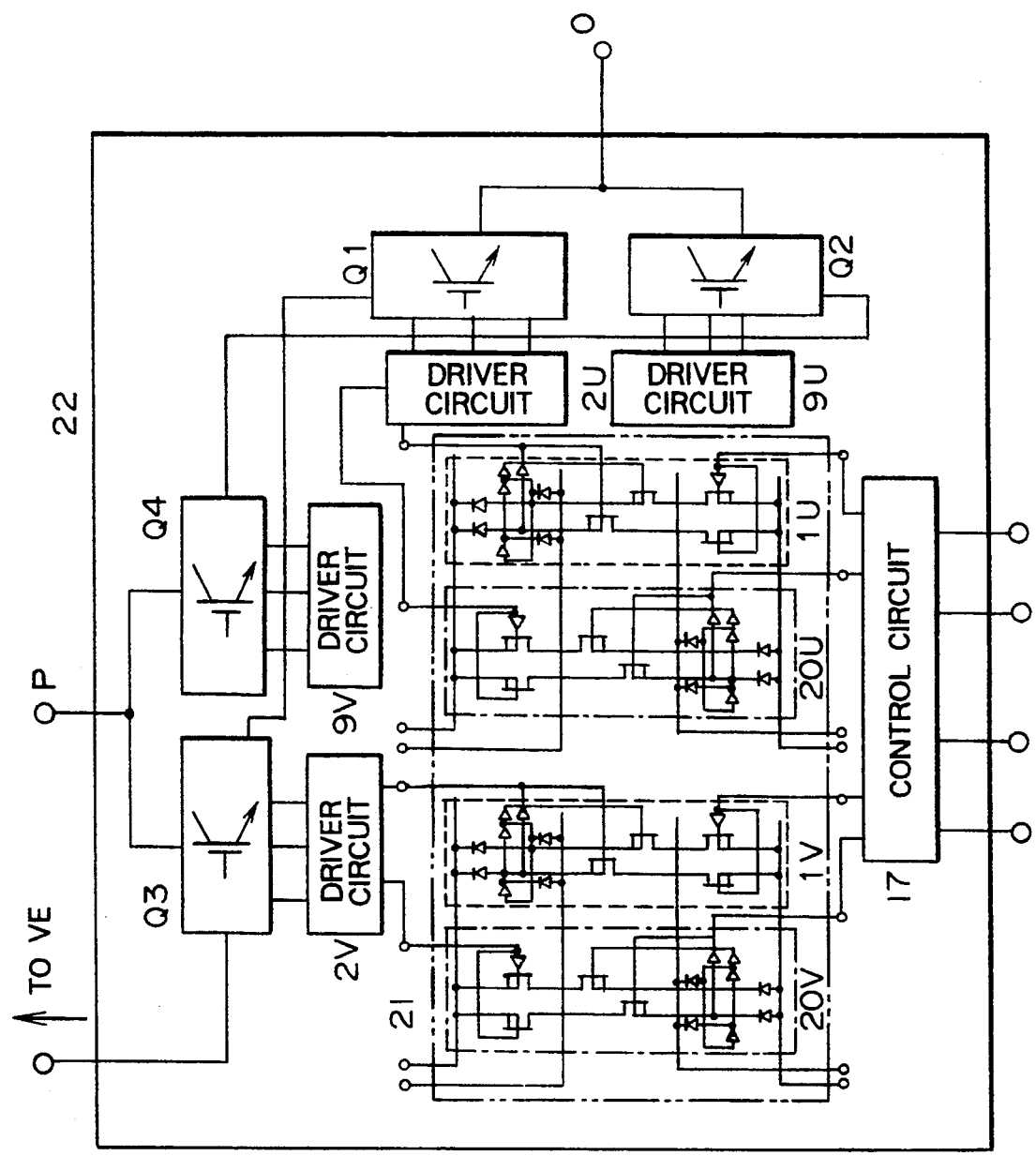
FIG. 8 is a configuration diagram of an inverter module having a step-up level shift circuit and a step-down level shift circuit according to the present invention.

In an inverter power module 22 shown in FIG. 8, the step-up level shift circuit 1 and the step-down level shift circuit 20 illustrated in FIG. 6 are mounted on one package together with output stage devices Q1 to Q4, driver circuits 2 and 9, and a control circuit 17.

In FIG. 8, Q1 to Q4 are the same as output stage devices shown in FIG. 2. A driver circuit 2U represents the P-channel MOSFET 2-1 and N-channel MOSFET 2-2 for Q1 of the U phase collectively. In the same way, a driver circuit 9U is a collection of the P-channel MOSFET 9-1 and N-channel MOSFET 9-2 for Q2 of the U phase. Driver circuits 2V and 9V are driver circuits of the V phase having the same configurations as those of the above described driver circuits 2U and 9U. The control circuit 17 is the same as that illustrated in FIG. 6. In an area 21 surrounded by a broken line, the step-up level shift circuit 1 and the step-down level shift circuit 20 of the U phase respectively represented by 1U and 20U are included. Together with them, the step-up level shift circuit 1V and the step-down level shift circuit 20V for the V phase respectively having the same configurations as those of 1U and 20U are also included in the area 21. Numeral 21 denotes an IC chip into which 1U, 20U, 1V and 20V are integrated by using the fact that each level shift circuit is low in loss. The IC 21 is hereafter referred to as level shift IC.

The level shift IC 21 is mounted on a substrate included in the power module 22. Furthermore, the level shift IC 21 has input terminals and output terminals of the step-up level shift circuit 1U and the step-down level shift circuit 20U. That is to say, the level shift IC 21 has terminals for connection to the power sources V1 and V2 shown in FIG. 6, an input terminal for the signal ST, an output terminal of the drive signal corresponding to the point D, an input terminal corresponding to the input terminal of the inverter 13, and an output terminal of the signal FAULT. In addition, the level shift IC 21 has these terminals for 1V and 20V. To the driver circuits 2U and 2V or the control circuit 17 mounted on the substrate in the power module, these terminals are connected by wiring.

If an inverter apparatus is integrated into one power module, it becomes less susceptible to influence of noise generated outside the module. Since the circuits are disposed in close proximity, however, the inverter apparatus has been conventionally susceptible to influence of noise. If the level shift IC 21 according to the present invention is mounted, however, influence of noise generated in the power module can be reduced by the effects of the step-up level shift circuit 1 and the step-down level shift circuit 20 less susceptible to noise as described before. As a result, the reliability of the inverter apparatus can be made higher.

The voltage of the high voltage power source of the inverter apparatus differs depending upon application. In such a case, various kinds of output stage devices and the level shift IC 22 having different voltages are prepared. According to the high voltage power source, suitable output stage devices and level shift IC 22 are selected and mounted. As a result, the driver circuit and control circuit, which are other components mounted on the module, can be made common regardless of the high voltage power source. The inverter apparatus can thus cope with various applications easily.

According to the voltage characteristics of the devices M1 to M8, the level shift IC 21 can be used for limited voltage. By connecting a plurality of level shift ICs in series, however, the above described voltage can be increased.

Figure 9:
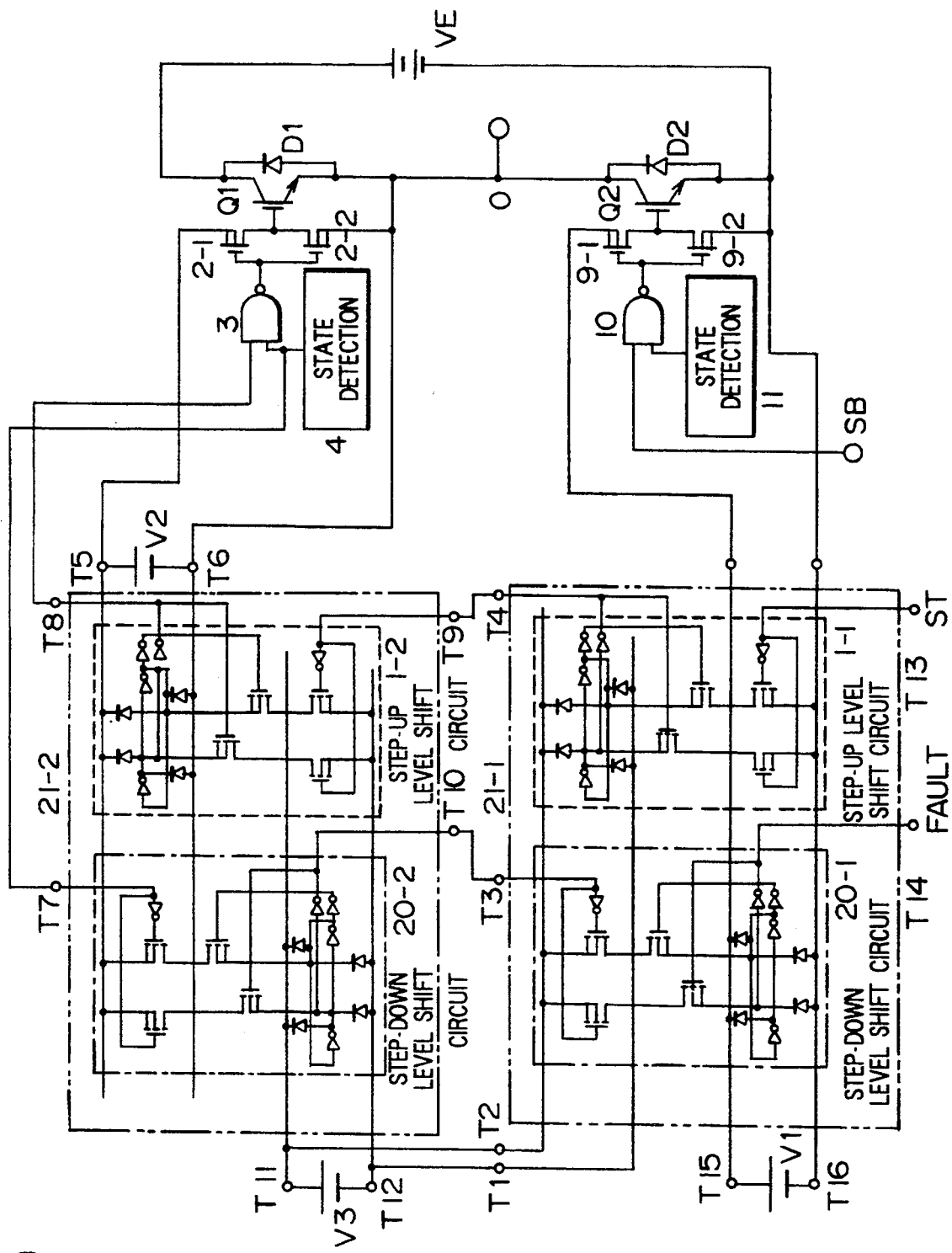
FIG. 9 is a configuration diagram showing coping with a higher voltage by using series connection of a step-up level shift circuit and a step-down level shift circuit according to the present invention.

In an embodiment shown in FIG. 9, two level shift ICs 21-1 and 21-2 are used. Step-up level shift circuits 1-1 and 1-2 included in these ICs are connected in series. Furthermore, step-down level shift circuits 20-1 and 20-2 are connected in series. In the present embodiment, output stage devices Q1 and Q2, freewheeling diodes D1 and D2, driver circuits 2 and 9, NAND circuits 3 and 10, and state detection circuits 4 and 11 are the same as those shown in FIG. 2. Furthermore, V1 denotes a low voltage power source for the lower arm of the level shift IC 21-1, and V2 denotes a low voltage power source for the upper arm of the level shift IC 21-2. V3 denotes a low voltage power source common to the upper arm of the level shift IC 21-1 and the lower arm of the level shift IC 21-2.

How to make a series connection of the level shift IC 21-1 and the level shift IC 21-2 will now be described. An output terminal (corresponding to the point D of FIG. 2) of the step-up level shift circuit included in 21-1 is connected to an input terminal (corresponding to ST of FIG. 2) of the step-up level shift circuit included in 21-2. An output terminal (corresponding to FAULT of FIG. 2) of the step-down level shift circuit included in 21-2 is connected to an input terminal of the state detection signal (corresponding to the input terminal of the inverter 13 of FIG. 2) of the step-down level shift circuit included in 21-1. Two high voltage devices (such as M1 and M2) included in each of trigger generator means of the step-up level shift circuit and the step-down level shift circuit are complementary in on/off state as described above. When the IC 21-1 and the IC 21-2 are connected in series, therefore, M1 of the IC 21-1 is in the on-state; M2 of the IC 21-1 is in the off-state; M1 of the IC 21-2 is in the on-state; and M2 of the IC 21-2 is in the off state. Applied voltage is shared between M2 of the IC 21-1 and M2 of the IC 21-2. Therefore, voltage applied to one level shift IC can be reduced.

By thus connecting a plurality of level shift ICs according to the present invention in series, the above described level shift IC can be used for inverter apparatuses having different voltages. Owing to use of common components, lower costs can be realized.

Heretofore, embodiments of the present invention have been described in detail. However, the present is not limited to the above described embodiments. Various design changes can be made without departing from the present invention stipulated in claims.

Into the level shift IC 21 in the example illustrated in FIG. 8, the step-up level shift circuits and the step-down level shift circuits of the U phase and V phase have been integrated. Besides them, the step-up level shift circuit and the step-down level shift circuit of the W phase may also be integrated into the same IC chip.

In the example illustrated in FIG. 9, each of the IC 21-1 and IC 21-2 has a step-up level shift circuit and a step-down level shift circuit for one phase. However, each IC may have step-up level shift circuits and step-down level shift circuits for a plurality of phases.

Furthermore, if a circuit configuration obtained by reversing the lower arm side and the upper arm side in the above described configuration is used, a step-down level shift circuit transmitting a signal from the upper arm to the lower arm can be made. By transmitting a state detection signal needed for protection operation to the control circuit at high speed, protection of the inverter apparatus is made possible.

As understood from the foregoing description, the present invention provides a high voltage characteristic and an excellent signal response characteristic. In addition, power consumption (or current consumption) can be reduced. Furthermore, false operation due to noise caused by dV/dt at the time of transition of power switching devices or other factors can be prevented.

We claim:

1. An inverter apparatus comprising:
    arms including first and second power switching devices connected in series between terminals of a high voltage power source;
    first and second driver means for selectively supplying outputs of first and second low voltage power sources disposed in respective arms to control electrodes of said first and second power switching devices;
    step-up level shift means for converting an input signal having a potential of one of electrodes of said first low voltage power source as a reference potential to a signal having a potential of one of electrodes of said second low voltage power source as a reference potential and transmitting the converted signal to said driver means;
    said step-up level shift means including flip-flop means connected to said second low voltage power source, first and second trigger generator means connected between said first low voltage power source and said second low voltage power source so as to responsive to said input signal to supply a set or reset signal to said flip-flop means;
    each of said first and second trigger generator means having a series circuit including voltage clamping means, a first switching device, and a second switching device;
    first switch means responsive to said input signal to turn on the second switching device of either said first trigger generator means or said second trigger generator means; and
    second switch means using output signals of said flip-flop means to switch on/off states of said first switching devices of said first and second trigger generator means complementarily to the second switching devices respectively connected in series with said first switching devices.

2. An inverter apparatus according to claim 1, wherein said second switch means uses output signals of said flip-flop means to apply a reverse bias voltage between a source electrode and a gate electrode of one of said two first switching devices and apply a forward bias voltage between a source electrode and a gate electrode of the other of said two first switching devices.

3. An inverter apparatus according to claim 2, wherein:
    said flip-flop means includes a first logic inverter supplied with said set trigger signal at an input terminal thereof and a second logic inverter supplied with said reset trigger signal at an input terminal thereof, an output terminal of said first logic inverter is connected to the input terminal of said second logic inverter, an output terminal of said second logic inverter is connected to the input terminal of said first logic inverter;

each of the two first switching devices includes in said set and reset trigger generator means comprising a P-channel MOS transistor having a source electrode connected to the input terminal of said first or second logic inverter;

said second switching means comprises a third logic inverter and a fourth logic inverter;

said third logic inverter has an input terminal connected to the output terminal of said second logic inverter and an output terminal connected to a gate electrode of said P-channel MOS transistor included in said set trigger generator means; and said fourth logic inverter has an input terminal connected to the output terminal of said first logic inverter and an output terminal connected to a gate electrode of said P-channel MOS transistor included in said reset trigger generator means.

4. An inverter apparatus according to claim 3, wherein a current flowing through the first and third switching devices included in said set trigger generator means is made, under the same supplied voltage condition, larger than a current flowing through the first and third switching devices included in said reset trigger generator means.

5. An inverter apparatus according to claim 1, further comprising:

at least two step-up level shift means are connected in series, wherein:

the output of said flip-flop means included in said step-up level shift means disposed on a low voltage side is connected to said input terminal of said step-up level shift means disposed on a high voltage side; and said second low voltage power source of said step-up level shift means disposed on said low voltage side is used as said first low voltage power source of said step-up level shift means disposed on said high voltage side.

6. An inverter apparatus comprising:

arms including first and second power switching devices connected in series between terminals of a high voltage power source;

first and second driver means for selectively supplying outputs of first and second low voltage power sources disposed in respective arms to control electrodes of said first and second power switching devices;

step-up level shift means for converting an input signal having a potential of a negative electrode of said first low voltage power source as a reference potential to a signal having a potential of one of electrodes of said second low voltage power source as a reference potential and transmitting the converted signal to said driver means;

state detection means supplied with power from said second low voltage power source to detect an operation state of said second power switching device;

step-down level shift means for converting a signal outputted by said state detection means to a signal having a potential of one of electrodes of said first low voltage power source as a reference potential;

said step-down level shift means including second flip-flop means connected to said first low voltage power source, third and fourth trigger generator means connected between said second low voltage power source and said first low voltage power source so as to responsive to the signal outputted by said state detection means to supply a set or reset signal to said second flip-flop means;

each of said third and fourth trigger generator means having a series circuit including second voltage clamping means, a third switching device, and a fourth switching device;

third switch means responsive to the signal outputted by said state detection means to turn on the fourth switching device of either said third trigger generator means or said fourth trigger generator means; and fourth switch means using output signals of said second flip-flop means to switch on/off states of said third switching devices of said third and fourth trigger generator means complementarily to the fourth switching devices respectively connected in series with said third switching devices.

7. An inverter apparatus according to claim 5, further comprising a plurality of step-up level shift means and step-down level shift means integrated and formed within an IC chip.

* * * * *